United States Patent
Pailthorp

[19]

[11] Patent Number: 6,100,815
[45] Date of Patent: Aug. 8, 2000

[54] COMPOUND SWITCHING MATRIX FOR PROBING AND INTERCONNECTING DEVICES UNDER TEST TO MEASUREMENT EQUIPMENT

[75] Inventor: Robert M. Pailthorp, Portland, Oreg.

[73] Assignee: Electro Scientific Industries, Inc., Portland, Oreg.

[21] Appl. No.: 08/998,156

[22] Filed: Dec. 24, 1997

[51] Int. Cl.[7] .................................................. H04Q 19/00
[52] U.S. Cl. .............................. 340/825.79; 340/825.06; 340/825.18; 340/10.1; 324/754; 324/758; 324/761
[58] Field of Search ..................... 340/825.54, 825.18, 340/825.06, 825.49, 10.1, 825.79; 324/754, 761, 758

[56] References Cited

U.S. PATENT DOCUMENTS

| | | | |
|---|---|---|---|
| 4,150,366 | 4/1979 | Price .................................. | 340/347 CC |
| 4,159,461 | 6/1979 | Kost et al. .............................. | 338/195 |
| 4,300,196 | 11/1981 | Lopresti ................................... | 364/489 |
| 4,300,207 | 11/1981 | Eivers et al. ............................. | 324/73 |
| 4,335,381 | 6/1982 | Connolly, Jr. et al. ........... | 340/347 CC |
| 4,381,441 | 4/1983 | Desmarais et al. ................ | 219/121 LJ |
| 4,392,107 | 7/1983 | Gollomp .............................. | 324/73 R |
| 4,402,055 | 8/1983 | Lloyd et al. ............................. | 364/579 |
| 4,580,030 | 4/1986 | Takeuchi ................................. | 338/195 |
| 4,719,459 | 1/1988 | Kovacs et al. ....................... | 340/825.8 |
| 4,763,124 | 8/1988 | Kovacs et al. ....................... | 340/825.8 |
| 4,851,838 | 7/1989 | Shier ....................................... | 341/121 |
| 5,124,638 | 6/1992 | Winroth .............................. | 324/158 R |
| 5,252,936 | 10/1993 | Norimatsu .............................. | 335/151 |
| 5,557,252 | 9/1996 | Ariyoshi ................................. | 338/195 |
| 5,644,115 | 7/1997 | Knauer ................................... | 200/175 |

FOREIGN PATENT DOCUMENTS

| | | | |
|---|---|---|---|
| 0103353 | 3/1984 | European Pat. Off. ........ | G01R 31/28 |
| 0509582 | 10/1992 | European Pat. Off. .......... | H01C 7/00 |

OTHER PUBLICATIONS

"Effective Switching Reduces Test Errors", Coyle, Electronics Test, vol. 12, No. 8, Aug. 1989.

*Primary Examiner*—Brian Zimmerman
*Assistant Examiner*—Yves Dalencourt
*Attorney, Agent, or Firm*—Stoel Rives LLP

[57] ABSTRACT

A compound switching matrix (30) operates in cooperation with a resistance measuring system (20) and a laser (22) to quickly and accurately trim resistors (12) to predetermined values while they are being measured. The compound switching matrix is implemented with dry reed relays (34–81, 101–164) and includes a probe switching matrix (90–97) and a configuration matrix (32) that reduce the average number of relay contacts required per probe to implement two-, three-, and four-terminal measurements with or without guarding. Moreover, the separate probe switching and measurement configuration matrices effectively separate the high and low sides of the measurement to reduce the effects of stray resistances and capacitances on measurement speed and accuracy. A switchable grounding configuration (82–89) further improves measurement accuracy. The compound switching matrix of this invention enables sequential resistance measurements of individual resistors in the array, with two-, three-, and four-terminal measurement configurations being adapted to resistors having values ranging from less than 0.1 ohm to greater than 100 Megohms.

11 Claims, 6 Drawing Sheets

COMPOUND SWITCHING MATRIX FOR PROBING AND INTERCONNECTING DEVICES UNDER TEST TO MEASUREMENT EQUIPMENT

TECHNICAL FIELD

The invention relates to the field of electrical test and measurement equipment, and more particularly to a compound switching matrix for electrically connecting measuring equipment to test probe arrays for measurement of individual devices in an array of such devices during laser trimming thereof.

BACKGROUND OF THE INVENTION

Continuing trends in electronic circuit miniaturization have led to the rapid development of circuit board surface mounted components, such as leadless "chip" capacitors, resistors, inductors, and integrated circuits. Chip resistors, in particular are very compact thick-film resistors ranging in size from smaller than about 1.0 mm by 0.5 mm (0.04 inch by 0.02 inch) to larger than about 3.0 mm by 1.5 mm (0.12 inch by 0.06 inch). Chip resistors are typically manufactured by screening and firing arrays of resistive paste materials forming resistance and connection-pad patterns on 49.5 mm by 60 mm (1.95 inch by 2.36 inch) ceramic substrates.

Figure 1:
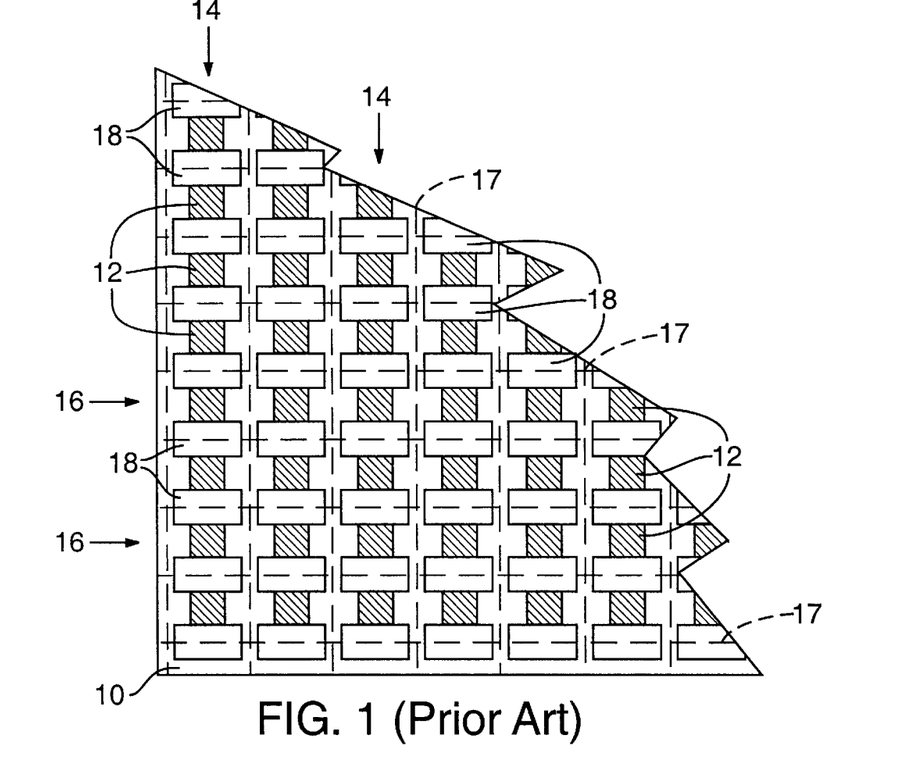
FIG. 1 is a plan view of an enlarged corner portion of a typical prior art resistor array deposited on a substrate.

FIG. 1 shows an enlarged cutaway corner portion of a typical prior art substrate 10 on which is screened an array of 5,336 resistors 12 arranged in 58 columns 14 and 92 rows 16. After firing, each of resistors 12 is laser trimmed to a predetermined resistance value. Substrate 10 is then divided along score lines 17 (shown in dashed lines) into individual chip resistors and/or groups of chip resistors.

On a typical substrate, such as substrate 10, resistors 12 in columns 14 are electrically connected end-to-end by conductive pads 18 so that resistors 12 in each of columns 14 are electrically connected in series. However, resistors 12 in rows 16 are not electrically connected side-by-side.

Figure 2:
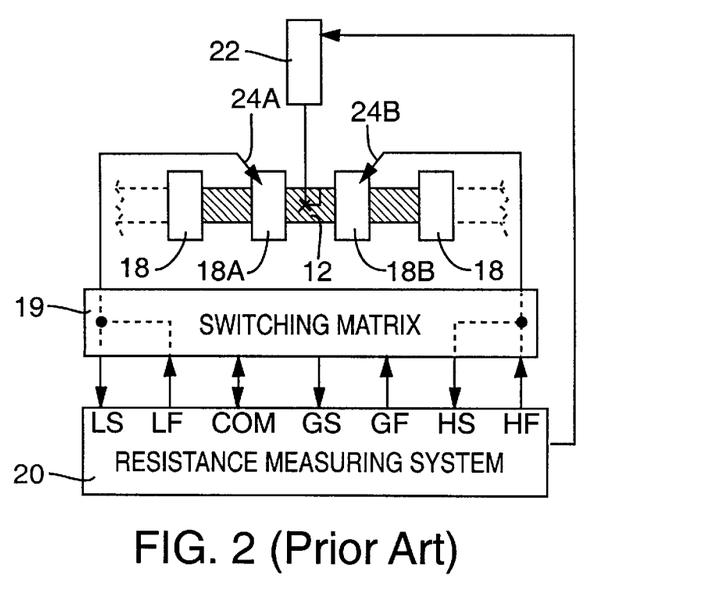
FIG. 2 is an simplified electrical block diagram of a prior art two-terminal resistance trimming and measurement system.

Referring also to FIG. 2, during laser trimming, entire rows 16 or columns 14 of resistors 12 are electrically connected to a switching matrix 19 that electrically connects resistors 12 one at a time to a resistance measuring system 20 that cooperates with a laser 22 to trim each successively connected resistor 12 to its predetermined resistance value. The electrical connections to resistors 12 are made by probing conductive pads 18A and 18B with probes 24A and 24B (collectively "probes 24").

Laser trimming is a fast and accurate process that can trim 100 resistors per second to well within 5% of their predetermined values. Because laser trimming accuracy requirements often exceed 0.1%, and the predetermined resistance values may range from less than 0.1 ohm to greater than 100 Megohms, switching matrix 19 typically employs "dry-reed" relays that have an on-resistance of only about 0.1 ohms, a very high off-resistance, an insulation resistance greater than 100,000 Megohms, an actuation time less than 0.5 milliseconds, and a contact-to-contact capacitance less than 1.0 picofarad.

A typical switching matrix 19 for laser trimming an array of resistors may require several hundred relays, which even considering their stringent electrical specifications may, nevertheless, compromise measurement accuracy. For example, capacitance or insulation resistance may accumulate to an unacceptable level if too many relay contacts are connected in parallel with the resistor under test.

Skilled workers know that there are many possible ways to interconnect a particular resistor under test to resistance measuring system 20. However, the most cost-effective interconnection technique may depend on the target resistance values of the resistors under test. As a general rule, for very low resistance values (0.1 ohms to about 100 ohms), four-terminal "Kelvin connection" measurements are preferred; for intermediate values (about 100 ohms to about 100 Kohms), two-terminal measurements that add a minimum of extra resistance in series with the measured resistor are preferred; and for very high values (greater than about 100 Kohms), three-terminal "guarded" measurements are preferred. Of course, four-terminal guarded measurements are probably the most accurate for measuring any resistance value.

There are, or course, exceptions to the general rule for determining which measurement configuration to use. Groups of resistors may be interconnected so as to increase the overall measured resistance level beyond 100 ohms while still requiring four-terminal measurements. Likewise, groups of resistors may be interconnected so as to decrease the overall measured resistance below 100 Kohms while still requiring three-terminal measurements. In addition, three-terminal measurements may be required at lower than usual resistance measuring values to guard against leakage paths caused by conductive trimming debris trimmed away by the laser.

Resistance measuring system 20 typically has seven terminals that may be connected to the resistor under test. They are referred to as High-Force ("HF"), High-Sense ("HS"), Low-Force ("LF"), Low-Sense ("LS"), Guard-Force ("GF"), Guard-Sense ("GS"), and ground or common ("COM"). Also, the HF and HS terminals are often referred to as "High" terminals and the LF and LS terminals are often referred to as "Low" terminals. The force and sense terminal pairs should be connected together directly or through some acceptably low resistance relative to the resistor under test. To ensure high measurement accuracy and speed, the connection technique employed should minimize stray resistance and capacitance between High to Low terminals. One way to avoid the detrimental effects of stray resistance and capacitance is by effectively connecting such strays between the High and Guard terminals or the Low and Guard terminals.

Prior switching matrices, such as switching matrix 19, typically have either three or six relay contacts associated with each probe 24.

In the six contact per probe matrix, each of probes 24 connects to one contact of each of the relays and the other contacts connect respective to HF, HS, LF, LS, GF, and GS. The six contact per probe matrix has complete flexibility because any of probes 24 can make a two-terminal connection to one end of resistor 12, can make one-half of a Kelvin connection to one end of resistor 12, or can make a guard probe connection as required.

In the three contact per probe matrix, there are two classes of probes. In both classes, each of probes 24 connects to one contact of each of the relays. In the first class, the other contacts connect respectively to HF, LF, and GF. In the second class, the other contacts connect respectively to HS, LS, and GS. Because the force and sense terminal pairs are connected together when a resistor is connected to the measurement system, the six and three contact per probe matrices are electrically equivalent with respect to the effects of stray resistances or capacitances connected across the resistor 12 under test.

For a given number of probes, the three contact per probe matrix cannot connect to as many resistors as the six contact per probe matrix because two probes, connected together are required at each end of each resistor 12. However, the three contact per probe matrix may be implemented employing relays having two pairs of contacts per relay. One pair of contacts is used for switching the sense terminals to a probe and the other set of contacts is used for switching the force terminals to another probe.

Some relays used in prior switching matrices employ grounded internal shields between the relay coil and the dry-reed contacts. Such shields reduce undesirable coupling between the relay coil and the contacts, effectively increase the open-contact-to-contact resistance, and reduce contact-to-contact coupling because stray signal currents flow from contact to shield rather than from contact to contact.

To further reduce the effects of stray resistance and capacitance, switching matrices are often divided into groups or banks by employing bank-switching relays to disconnect the measurement system terminals from unused relays.

However, none of the above-described switch matrices can economically satisfy the ever-growing resistor array trimming requirements. For example, what is needed is a switching matrix that can economically interconnect resistance measuring system 20 via 192 probes to 48 or 96 resistors 12 in two-, three-, and four-terminal measurement configurations. The fully flexible, prior art six contact per probe matrix requires 1,152 (6×192) contacts (1,152 single contact or 576 dual-contact relays), without resorting to expensive bank switching. The prior art three contact per probe matrix does not meet the 96 resistor requirement.

Because each probe has contacts connected to High and Low terminals, it is possible for the stray capacitance and resistance of the many open contacts to be connected across the resistor under test, causing significant degradations in measurement speed, accuracy, and signal-to-noise ratio. Using internal relay shields reduces this problem, but at an accompanying additional cost. Bank switching can also reduce, but not eliminate, stray capacitance and resistance. Connecting the driven guard terminal to as many as necessary of the unused probes eliminates most leakage problems, but requires the simultaneous operation of many relays, which increases power consumption.

What is needed, therefore, is an inexpensive probe switching matrix for connecting a selected resistor in an array of more than 90 resistors to a resistance measuring system at a rate exceeding thousands resistors per minute without degrading the resistance measuring performance as compared to measuring a single resistor directly connected to the measurement system.

SUMMARY OF THE INVENTION

An object of this invention is, therefore, to provide an apparatus and a method for flexibly interconnecting an array of devices under test to a parameter measurement system.

Another object of this invention is to provide an apparatus and a method for improving the measurement speed, accuracy, and signal-to-noise ratio of such a parameter measurement system.

A further object of this invention is to provide an apparatus and a method for individually connecting resistors in array of more than 90 resistors to a resistance measuring system that is part of a laser trimming system.

Still another object of this invention is to provide an apparatus and a method for individually connecting resistors in array of more than 90 resistors to a resistance measuring system for performing two-, three-, or four-terminal measurements.

A preferred embodiment of a compound switching matrix of this invention operates in cooperation with a resistance measuring system and a laser to quickly and accurately trim resistors to predetermined values while they are being measured. The compound switching matrix is implemented with dry reed relays and includes a probe switching matrix and a configuration matrix that reduce the average number of relay contacts required per probe to implement two-, three-, and four-terminal measurements with or without guarding. Moreover, the separate probe switching and measurement configuration matrices effectively separate the high and low sides of the measurement to reduce the effects of stray resistances and capacitances on measurement speed and accuracy. A switchable grounding configuration further improves measurement accuracy. The compound switching matrix of this invention enables sequential resistance measurements of individual resistors in the array, with two-, three-, and four-terminal measurement configurations being adapted to resistors having values ranging from less than 0.1 ohm to greater than 100 Megohms.

Additional objects and advantages of this invention will be apparent from the following detailed description of a preferred embodiment thereof that proceeds with reference to the accompanying drawings.

DETAILED DESCRIPTION OF A PREFERRED EMBODIMENT

Figure 3:
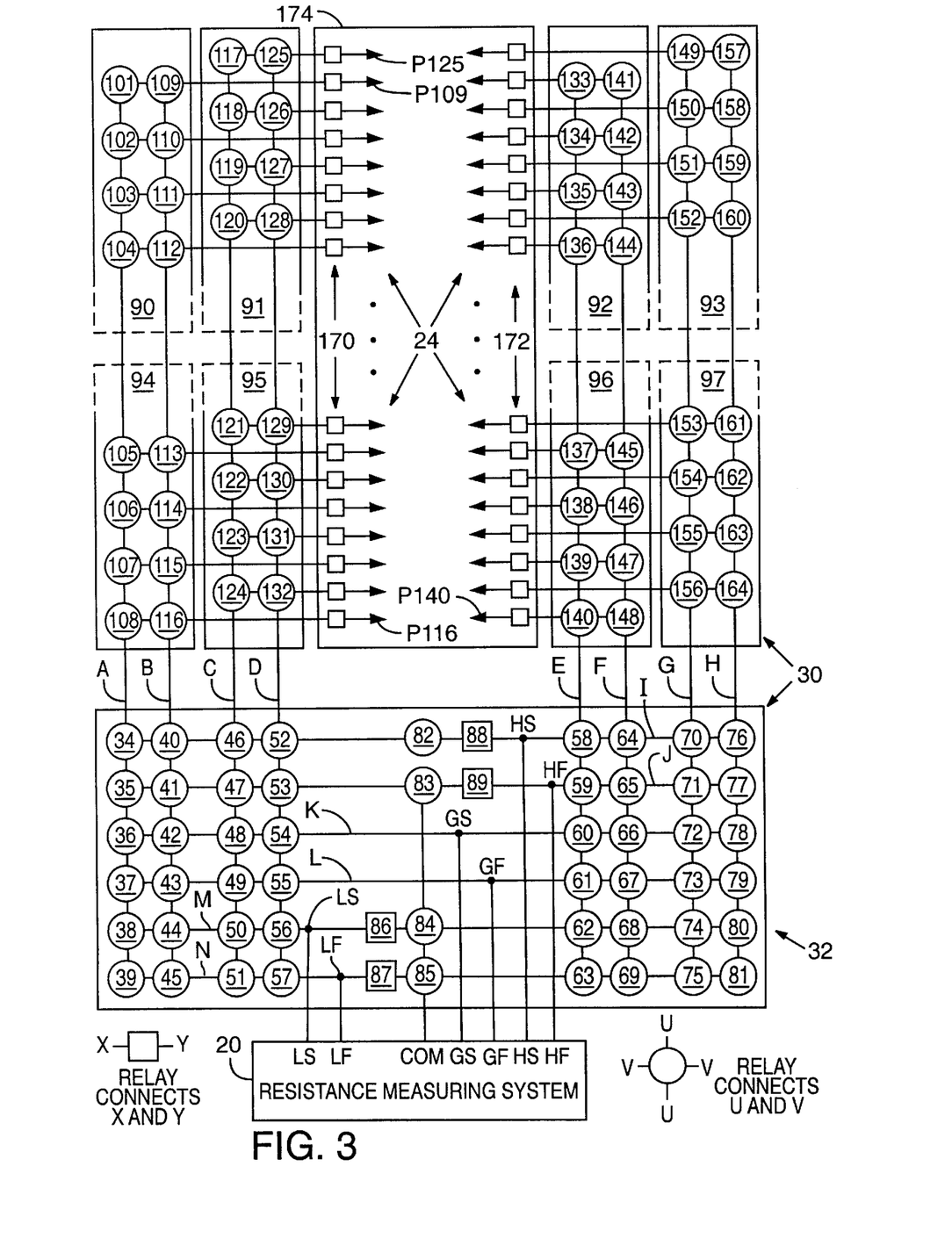
FIG. 3 is an electrical block diagram of a compound switching matrix of this invention for connecting an array of probes to a resistance measuring system.

FIG. 3 shows a preferred embodiment of this invention in which a compound switching matrix 30 requires only 440 single contact relays to perform 96 two-terminal measurements or 48 four-terminal measurements with 192 probes. The reduced number of relays employed by this invention increases reliability, reduces cost, and maintains measurement accuracy.

Compound switching matrix 30 includes a configuration matrix 32 in which dry reed configuration relays 34 through 89 electrically interconnect the terminals of resistance measuring system 20 via inter-matrix conductors A, B, C, D, E, F, G, and H to one or more probe matrices, such as probe matrices 90, 91, 92, 93, 94, 95, 96, and 97. To enhance performance and configuration flexibility it is preferably to group pairs of the probe matrices on separate circuit boards. In particular, probe matrices 90 and 93, 91 and 92, 94 and 97, and 95 and 96 are grouped on four circuit boards (not shown). The four probe matrices are shown herein as eight matrices merely to clarify their electrical interconnections. Probe matrices 90 through 97 include probe relays 101 through 164 electrically interconnecting inter-matrix conductors A, B, C, D, E, F, G, and H through probe card connectors 170 and 172 to a probe card 174 that mounts and positions probes 24. Compound switching matrix 30 is capable of electrically connecting any of probes 24 to any of the terminals on resistance measuring system 20. (Hereafter, particular ones of probes 24 are identified by the letter "P" followed by a numerical suffix that is the same as its closest associated probe relay identifying number, e.g., probe P125, probe P109, probe P116, and probe P140.)

In the preferred embodiment, each of probes 24 is electrically connected to two probe relays, e.g., probe P125 is connected to probe relays 117 and 125 of probe matrix 91. Each probe relay is electrically connected to one of the inter-matrix conductors, e.g., probe relay 117, when activated by a control signal (not shown), makes an electrical connection between probe P125 and inter-matrix conductor C. In turn, each inter-matrix conductor is electrically connected to a group of configuration relays, e.g., inter-matrix conductor C is electrically connected to configuration relays 46 through 51, and each configuration relay is electrically connected to one of terminal buses I, J, K, L, M, and N, e.g., configuration relays 37, 43, 49, 55, 61, 67, 73, and 79 are electrically connected to terminal bus L. Configuration relays 34 through 89 are activated by control signals (not shown) to selectively connect inter-matrix conductors A through H to terminal buses I through N. Terminal buses I through N are electrically connected to respective resistance measuring system 20 terminals HS, HF, GS, GF, LS, and LF.

As described with reference to FIG. 2, resistance measuring system 20 also includes a COM terminal, which can be electrically connected through configuration relays 82 through 85 to respective terminal buses I, J, M, and N. To increase measurement accuracy, the HF and HS terminals can be electrically isolated from inter-matrix conductors A through D by actuating configuration relays 82 and 83 and opening configuration relays 88 and 89. This grounds the left portions of terminal buses I and J associated with inter-matrix conductors A through D, disconnects terminals HS and HF from the left portions of terminal buses I and J, and limits terminals HS and HF to electrical connections with inter-matrix conductors E through H.

Likewise, the LS and LF terminals can be electrically isolated from inter-matrix conductors E through H by actuating configuration relays 84 and 85 and opening configuration relays 86 and 87. This grounds right portions of terminal buses M and N associated with inter-matrix conductors E through H, disconnects LS and LF from the right portions of terminal buses M and N, and limits terminals LS and LF to electrical connections with inter-matrix conductors A through D.

The configuration relays and probe relays employed in this invention do not have internal shields. However, they are actuated by layer wound coils in which the inner coil layer, i.e., the layer closest to the dry reed contacts, is electrically connected to the COM terminal or ground. Therefore, when the relay is not actuated, the coil acts as a shield, and when the relay is actuated, some relay-activating voltage or current may be coupled to the dry reed contacts, but the amount of coupling is minimized by the grounded inside coil layer.

EXAMPLES

Figure 4:
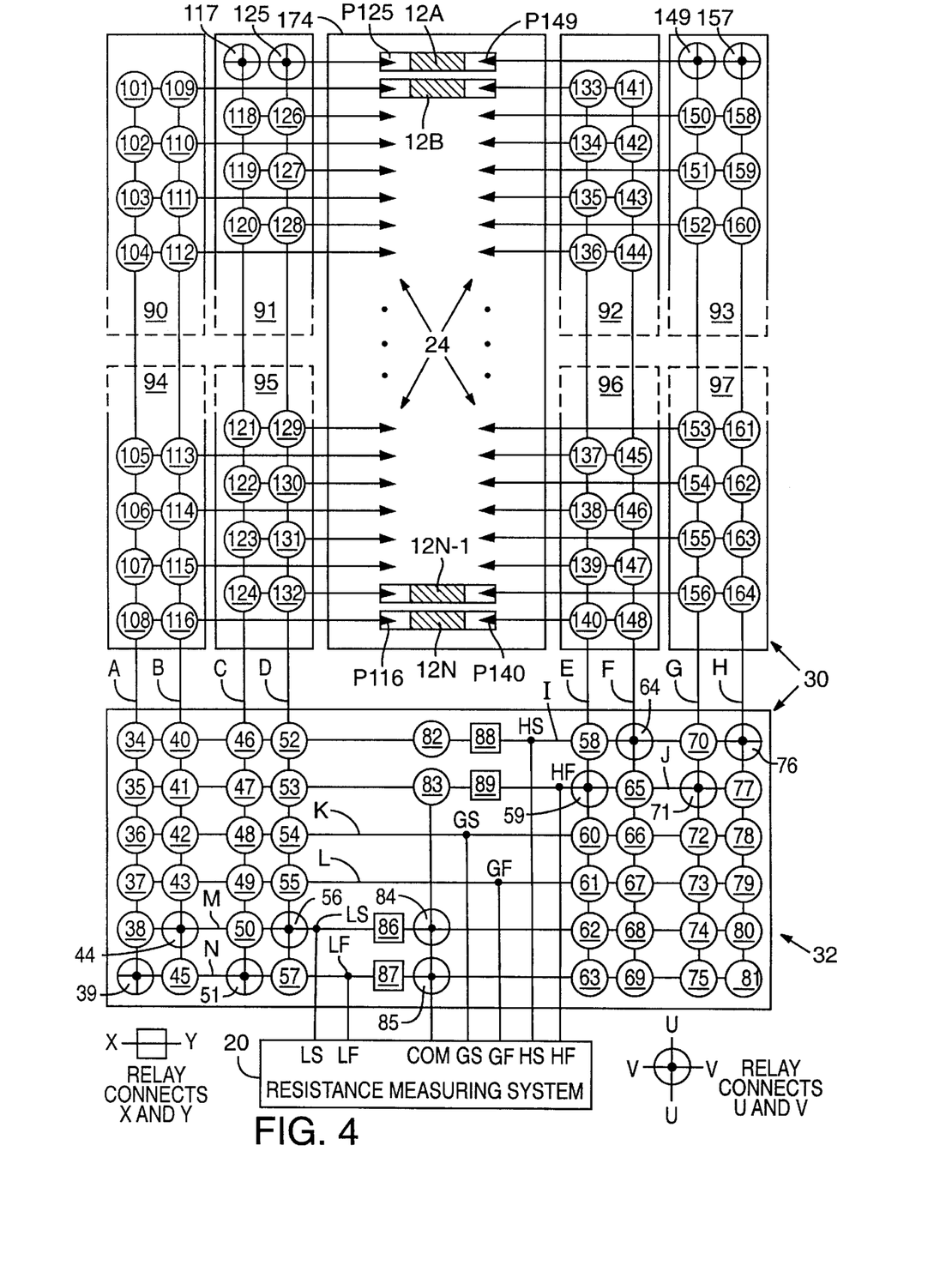
FIG. 4 is an electrical block diagram of the compound switching matrix of FIG. 3 shown in a two-terminal resistance measurement configuration suitable for probing and measuring arrays of resistors having moderate resistance values.

FIG. 4 shows compound switching matrix 30 in a two-terminal resistance measurement configuration suitable for probing and measuring arrays of resistors having moderate resistance values ranging from about 100 ohms to about 100 Kohms. Configuration matrix 32 is set to this configuration by actuating configuration relays 39, 44, 51, and 56, which electrically connects terminals LS and LF to inter-matrix conductors A through D; and by actuating configuration relays 59, 64, 71, and 76, which electrically connects terminals HS and HF to inter-matrix conductors E through H. The GS and GF terminals are not used in this two-terminal resistance measurement configuration.

To increase measurement accuracy, the HF and HS terminals are electrically isolated from inter-matrix conductors A through D by actuating configuration relays 82 and 83 and opening configuration relays 88 and 89, and the LS and LF terminals are electrically isolated from inter-matrix conductors E through H by actuating configuration relays 84 and 85 and opening configuration relays 86 and 87.

In the two-terminal configuration, probes 24 are spaced apart such that each opposing pair of probes 24 contact a single one of resistors 12. For example, FIG. 4 shows resistors 12A, 12B, . . . through 12N in which resistor 12A is probed by probes P125 and P149, and resistor 12N is probed by probes P116 and P140.

Two-terminal resistance measurement of exemplary resistor 12A is made by resistance measuring system 20 forcing a predetermined amount of measurement current from terminal HF, through configuration relay 71 and probe relay 149 to probe P149. The measurement current flows through resistor 12A, into probe P125, and returns to terminal LF through probe relay 117 and configuration relay 51. The measurement current flowing through resistor 12A generates across probes P125 and P149 a measurement voltage that is sensed at terminals HS and LS as follows. Probe P149 is electrically connected to terminal HS through probe relay 157 and configuration relay 76, and probe P125 is electrically connected to terminal LS through probe relay 125 and configuration relay 56. Because the approximate 0.2 ohm contact resistance of probes P125 and P149 is small compared to the moderate resistances of resistor 12A, voltage drop errors caused by the measurement current flowing through the probes can be ignored or compensated for with a simple offset.

Figure 5:
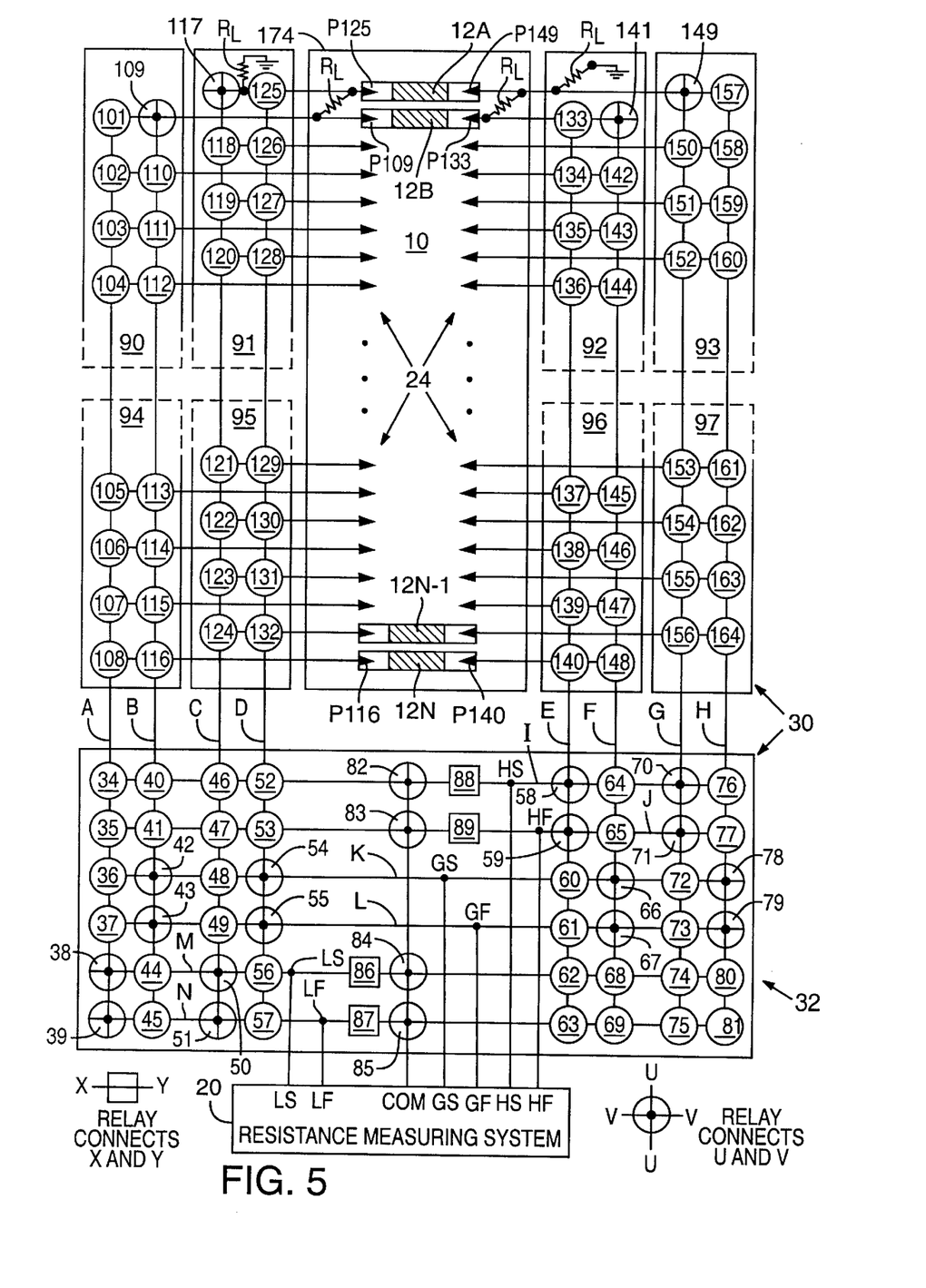
FIG. 5 is an electrical block diagram of the compound switching matrix of FIG. 3 shown in a three-terminal resistance measurement configuration suitable for probing and measuring arrays of resistors having high resistance values.

FIG. 5 shows compound switching matrix 30 in a three-terminal resistance measurement configuration suitable for probing and measuring arrays of resistors having high resistance values greater than about 100 Kohms. Configuration matrix 32 is set to this configuration by actuating configuration relays 38, 39, 50, and 51, which electrically connects together the Low terminals and inter-matrix conductors A and C; by actuating configuration relays 58, 59, 70, and 71, which electrically connects together the High terminals and inter-matrix conductors E and G; and by actuating configuration relays 42, 43, 54, 55, 66, 67, 78, and 79, which electrically connects together the Guard terminals and applies a virtual ground guard voltage to inter-matrix conductors B, D, F, and H.

To increase measurement accuracy, the High terminals are isolated from inter-matrix conductors A through D by actuating configuration relays 82 and 83 and opening configuration relays 88 and 89, and the Low terminals are isolated from inter-matrix conductors E through H by actuating configuration relays 84 and 85 and opening configuration relays 86 and 87.

In the three-terminal configuration, probes 24 are spaced apart such that each opposing pair of probes 24 contact a single one of resistors 12. For example, FIG. 5 shows resistors 12A, 12B, . . . through 12N in which resistor 12A is probed by probes P125 and P149, and resistor 12N is probed by probes P116 and P140.

Three-terminal resistance measurement of exemplary resistor 12A is made by resistance measuring system 20 forcing a predetermined amount of measurement voltage across resistor 12A, and sensing the resultant measurement current flowing therethrough. The measurement voltage is forced across terminals HF and LF and conveyed to resistor 12A from terminal HF, through configuration relay 71, probe relay 149, to probe P149, and from terminal LF through configuration relay 51, probe relay 117, to probe P125. Terminals HF and HS are electrically connected together by configuration relays 58, 59, 70, and 71, and terminals LF and LS, which are at the virtual ground potential, are electrically connected together by configuration relays 38, 39, 50, and 51. The predetermined measurement voltage across resistor 12A causes a measurement current to flow into terminal LF, which resistance measuring system 20 converts to a measured resistance value.

Because resistor 12A has a high resistance value, the measurement current may be very small, and a smaller, but significant portion of the measurement current may be diverted as a leakage current that flows through Low side leakage resistance paths $R_L$ formed, for example, between resistors 12A and 12B, and between probe-related wiring on probe matrices 91 and 92 and their associated ground planes.

To reduce or eliminate the effects of leakage current, the virtual ground guard voltage that is generated by terminal GF and connected to inter-matrix conductors B, D, F, and H, is electrically connected through probe relays 109 and 141 to respective probes P109 and P133 on resistor 12B. Because the guard voltage is at or about the same potential as the Low side of resistor 12A, very little leakage current can flow through the Low side leakage resistances.

Likewise, small voltage drop errors can occur because of the measurement current flowing through the contact resistances and wiring associated with probe relays 117 and 149 and probes P125 and P149. However, because the combined resistances are less than about 2.5 ohms, which is very small compared to the greater than 100 Kohm resistance of resistor 12A, the voltage drop errors are negligible.

The three-terminal configuration shown in FIG. 5 allows connecting any of Low side probes 24 to the Low or guard terminals, and connecting any of High side probes 24 to the High or Guard terminals.

Figure 6:
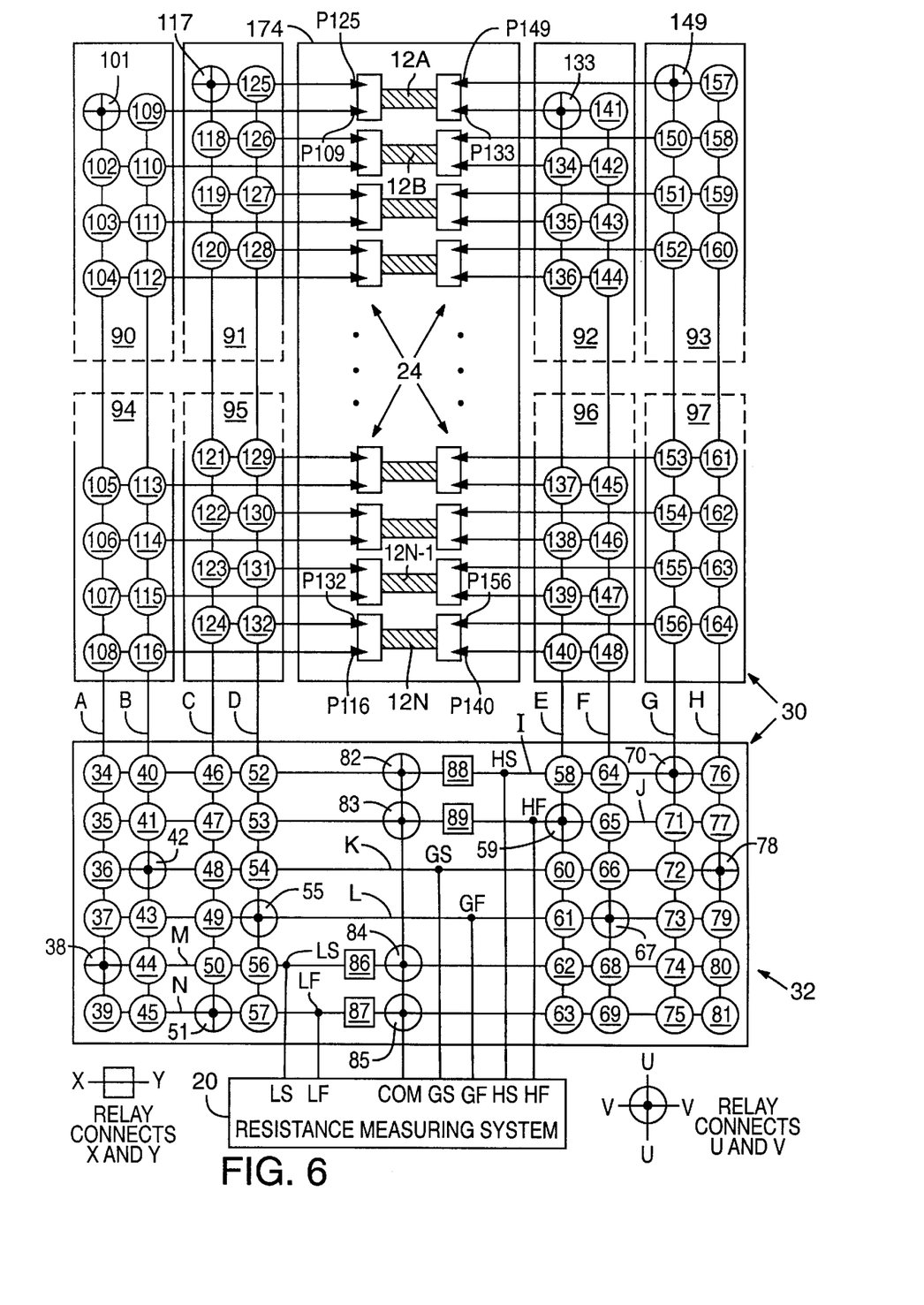
FIG. 6 is an electrical block diagram of the compound switching matrix of FIG. 3 shown in a four-terminal resistance measurement configuration suitable for probing and measuring arrays of resistors having low resistance values.

FIG. 6 shows compound switching matrix 30 in a four-terminal resistance measurement configuration suitable for probing and measuring arrays of resistors having low resistance values ranging from about 0.1 ohm to about 100 ohms. Configuration matrix 32 is set to this configuration by actuating configuration relays 38, 51, 59, and 70, which electrically connect respective terminals LS, LF, HF, and HS to respective inter-matrix conductors A, C, E, and G; actuating configuration relays 42 and 78, which electrically connects terminal GS to inter-matrix conductors B and H; and actuating configuration relays 55 and 67, which electrically connects terminal GF to inter-matrix conductors D and F.

In the four-terminal configuration, probes 24 are spaced apart such that two adjacent pairs of probes 24 contact a single ones of resistors 12. For example, FIG. 6 shows resistors 12A, 12B, . . . through 12N in which resistor 12A is probed by probes P125, P149, P109, and P133, and resistor 12N is probed by probes P132, P156, P116, and P140. Of course, the probes to not have to be adjacent, and various probe spacings, or combinations of probes, may be adapted to a variety of resistor array sizes and configurations.

Four-terminal resistance measurement of exemplary resistor 12A is made by resistance measuring system 20 forcing a predetermined amount of measurement current from terminal HF through configuration relay 59 and probe relay 133 to probe P133. The measurement current flows through resistor 12A, into probe P125, and returns to terminal LF through probe relay 117 and configuration relay 51. The measurement current flowing through resistor 12A generates across probes P109 and P149 a measurement voltage that is sensed by high-impedance (low current draw) terminals HS and LS as follows. Probe P149 is electrically connected to terminal HS through probe relay 149 and configuration relay 70, and probe P109 is electrically connected to terminal LS through probe relay 101 and configuration relay 38. Because the measurement current flows through probes P133 and P125 and probes P109 and P149 sense the measurement voltage without drawing any significant current sensed, the measurement voltage at terminals HS and LS is not altered by probe-, connector-, or wiring-related resistance.

The four-terminal configuration shown in FIG. 6 is suitable for making 4-terminal connections to any of resistors 24 and also permits sensing a guard voltage with one of probes 24 and forcing a guard voltage with a different one or ones of probes 24 as described with reference to FIG. 5.

The resistance measuring configurations described with reference to FIGS. 4, 5, and 6 are suitable for most chip resistor trimming and similar applications, and are advantageous because configuration matrix 32 does not have to change while trimming different resistors in the array, which maximizes configuration relay operating life. Moreover, probe relays actuate on the average of only once or twice for each group of resistors being probed at any one time.

For a switching matrix employing more than 13 probes, compound switching matrix 30 is further advantageous because it uses fewer relays than a conventional 6 contacts-per-probe switching matrix and has the switching flexibility to rapidly make high accuracy resistance measurements for most values of resistors. Of course, compound switching matrix 30 is particularly advantageous for laser trimming arrays of similar chip resistors formed on a substrate.

Figure 7:
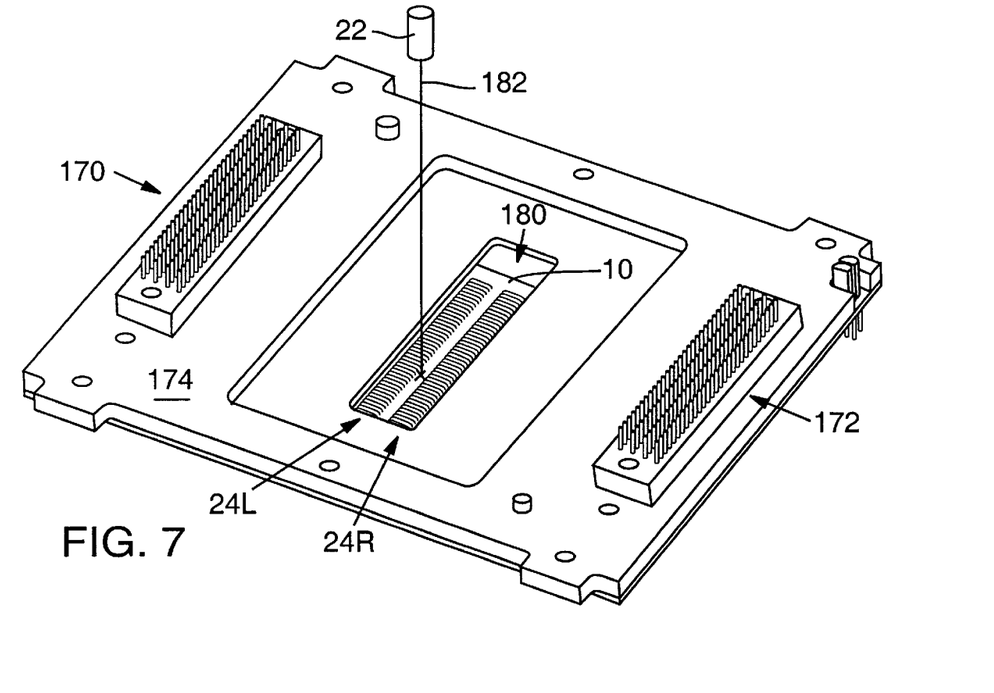
FIG. 7 is an isometric view of a probe card of this invention.
Figure 8:
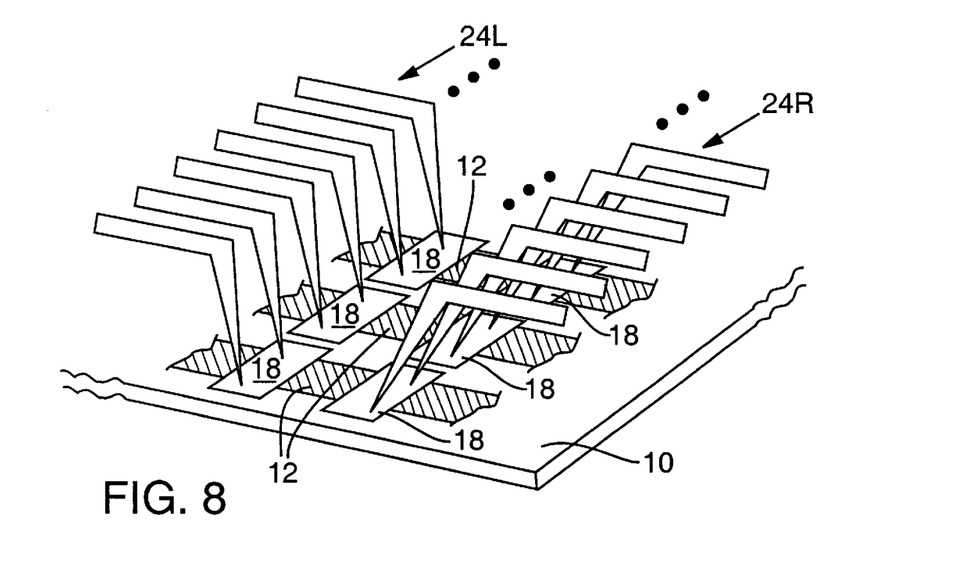
FIG. 8 is an isometric view of a portion of the probe card of FIG. 7 enlarged to reveal multiple probes contacting a resistor array in a four-terminal per resistor configuration.

FIGS. 7 and 8 show the preferred physical arrangement of probe card 174 in which probe card connectors 170 and 172 are electrically connected to respective rows of probes 24L and 24R, which are positioned with associated opposing pairs of probes contacting conductive pads 18 of resistors 12 on substrate 10. Probe card 174 includes an opening 180 positioned above rows of probes 24L and 24R that allows directing a laser beam 182 across resistors 12 to trim them to their predetermined values.

A four-terminal per resistor configuration is revealed in FIG. 8, but other configurations are possible as described with reference to FIGS. 4 and 5.

The effects of leakage currents and probe card capacitance can be minimized by configuring compound switching matrix 30 to electrically connect the Low and Guard terminals to probes 24L and the High and Guard terminals to probes 24R.

Skilled workers will recognize that portions of this invention may be implemented differently from the above-described implementations. For example, compound switching matrix 30 may be configured for use in applications different than those set forth in the above-described examples. It is possible to connect any of probes 24K and 24R to a High or Low terminal, thereby some relay capacitance across the resistor under test, which might be acceptable in some applications, such as measuring lower value resistors. The examples show probing resistors in disconnected adjacent rows, but probing resistors in connected adjacent columns is possible and may be used for measuring resistors in buried node configurations. In another variation, one column of resistors may be measured by probes 24L and another column of resistors may be measured by probes 24R. Moreover, this invention is not limited to probing and measuring resistors, but is also useful for probing, trimming, or measuring many other devices, such as capacitors, inductors, and delay lines. Of course, more or fewer probes and probe matrices may be employed, and they may be have a variety of different sizes, spacings, and arrangements, and be used with or without laser trimming, as needed to suit various applications. For example, this invention is also suitable for probing at least about 25 devices with at least about 100 probes.

It will be obvious, therefore, to those having skill in the art that many other changes may be made to the details of the above-described embodiment of this invention without departing from the underlying principles thereof. Accordingly, it will be appreciated that this invention is also applicable to probing applications other than those found in resistor laser trimming applications. The scope of the present invention should, therefore, be determined only by the following claims.

What is claimed is:

1. A compound switching matrix apparatus for interconnecting a set of devices that each include first and second contacts to first and second sets of terminals on a measurement system, comprising:

a first set of probes contacting the first contacts on the set of devices;

a second set of probes contacting the second contacts on the set of devices;

first set of probe matrix relays mounted on a first circuit board for selectively interconnecting the first set of probes to a first set of inter-matrix conductors;

a second set of probe matrix relays mounted on a second circuit board for selectively interconnecting the second set of probes to a second set of inter-matrix conductors, the first and second circuit boards electrically isolating the first set of probe matrix relays and inter-matrix conductors from the second set of probe matrix relays and inter-matrix conductors:

a first set of configuration matrix relays selectively interconnecting the first set of terminals on the measurement system to the first set of inter-matrix conductors;

a second set of configuration matrix relays selectively interconnecting the second set of terminals on the measurement system to the second set of inter-matrix conductors; and a laser that cooperates with the measurement system to laser trim a device in the set of devices to a predetermined value.

2. The apparatus of claim 1 in which the set of probe matrix relays and the set of configuration matrix relays comprise dry reed relays.

3. The apparatus of claim 1 in which the set of devices includes at least one of a set of resistors, a set of capacitors, a set of inductors, and a set of delay lines.

4. The apparatus of claim 1 in which the set of devices is an array of resistors formed on a substrate.

5. The apparatus of claim 4 in which the measurement system is a resistance measuring system that cooperates with the laser to laser trim a resistor in the array of resistors to a predetermined value.

6. The apparatus of claim 1 in which the set of devices includes at least 25 devices and the first and second sets of probes each include at least 50 probes.

7. The apparatus of claim 1 in which the first and second sets of probe matrix relays and the first and second sets of configuration matrix relays together include about 440 relays and the first and second sets of probes include about 192 probes.

8. The apparatus of claim 1 in which each probe in the first set of probes is connected to 2 relays in the first set of probe matrix relays, and each probe in the second set of probes is connected to 2 relays in the second set of probe matrix relays.

9. The apparatus of claim 1 in which the first and second sets of probes are mounted on a probe card that is physically separated from the first and second circuit boards by first and second probe card connectors that electrically connect the first and second sets of probes to the respective first and second sets of probe matrix relays.

10. The apparatus of claim 1 in which the first set of terminals comprise at least Hi force and Hi sense terminals and the second set of terminals comprise at least Lo force and Lo sense terminals on a resistance measurement system.

11. The apparatus of claim 10 in which the measurement system effects a four-terminal measurement by employing odd members of the first set of probes to connect the Hi force terminals to the first contacts on the set of devices, even members of the first set of probes to connect the Hi sense terminals to the first contacts on the set of devices, odd members of the second set of probes to connect the Lo force terminals to the second contacts on the set of devices, and even members of the second set of probes to connect the Lo sense terminals to the second contacts on the set of devices.

* * * * *

UNITED STATES PATENT AND TRADEMARK OFFICE
CERTIFICATE OF CORRECTION

PATENT NO : 6,100,815
DATED : August 8, 2000
INVENTOR(S) : Robert M. Pailthorp

It is certified that error appears in the above-identified patent and that said Letters Patent are hereby corrected as shown below:

Claim 1, column 9, line 45, "first set" should read --a first set--.

Claim 1, column 9, line 54, "conductors:" should read --conductors;--.

Signed and Sealed this

Tenth Day of April, 2001

Attest:

NICHOLAS P. GODICI

Attesting Officer   Acting Director of the United States Patent and Trademark Office